United States Patent
Yamakoshi et al.

[11] Patent Number: 5,099,452
[45] Date of Patent: Mar. 24, 1992

[54] SEMICONDUCTOR MEMORY INCLUDING REDUCED CAPACITIVE COUPLING BETWEEN ADJACENT BIT LINES

[75] Inventors: Hiroyuki Yamakoshi; Hidehiro Asai, both of Tokyo, Japan

[73] Assignee: NEC Corporation, Tokyo, Japan

[21] Appl. No.: 371,904

[22] Filed: Jun. 27, 1989

[30] Foreign Application Priority Data

Jun. 27, 1988 [JP] Japan .................. 63-158731

[51] Int. Cl.$^5$ .................. G11C 7/02; G11C 11/407
[52] U.S. Cl. .................. 365/190; 365/206; 365/210; 365/230.05; 365/63
[58] Field of Search .................. 365/51, 63, 210, 190, 365/230.05, 206

[56] References Cited

U.S. PATENT DOCUMENTS

| 4,551,820 | 11/1985 | Matsuura | 365/210 |
| 4,689,770 | 8/1987 | Miyamoto et al. | 365/51 |
| 4,916,661 | 4/1990 | Nawaki et al. | 365/63 |
| 4,922,459 | 5/1990 | Hidaka | 365/63 |

FOREIGN PATENT DOCUMENTS 0256297 11/1987 Japan .................. 365/206

Primary Examiner—Glenn Gossage
Attorney, Agent, or Firm—Sughrue, Mion, Zinn, Macpeak & Seas

[57] ABSTRACT

A semiconductor memory apparatus comprises a plurality of complementary bit line pairs for accessing memory cells. Each of the memory cells is accessed by two complementary bit line pairs. Each of the complementary bit line pairs is connected to a corresponding sense amp circuit for amplifying a signal level difference between bit lines of a corresponding bit line pair. A plurality of sealed lines, each being connected to ground and being positioned between two adjacent bit lines of different complementary bit line pairs, are provided to avoid the formation of a line-to-line capacitance between the two adjacent bit lines.

2 Claims, 5 Drawing Sheets

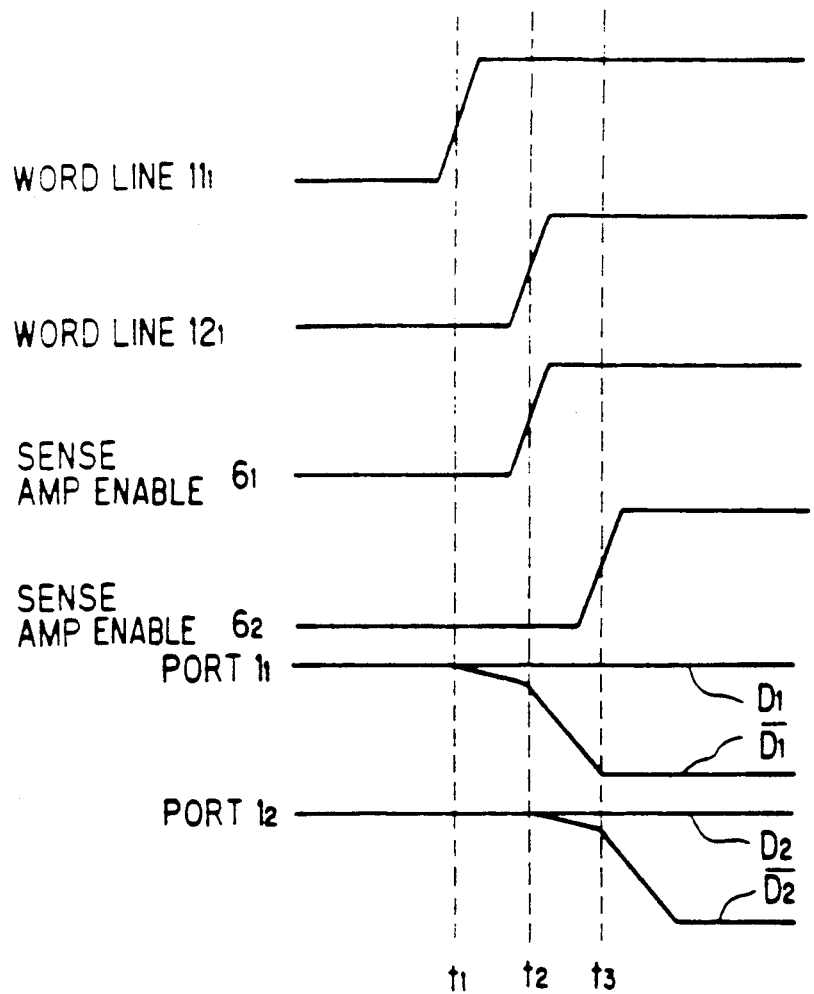

SEMICONDUCTOR MEMORY INCLUDING REDUCED CAPACITIVE COUPLING BETWEEN ADJACENT BIT LINES

FIELD OF THE INVENTION

The invention relates to a semiconductor memory apparatus, and more particularly to a semiconductor memory apparatus having complementary bit lines, each connected to a sense amp circuit.

BACKGROUND OF THE INVENTION

A conventional semiconductor memory apparatus of a complementary bit line type comprises a predetermined number of memory cells to provide a desired memory capacity, a predetermined number of complementary bit line pairs, among which each two complementary bit line pairs are connected to a corresponding memory cell to provide dual ports, a predetermined number of word lines, two of which word lines are connected to a corresponding memory cell to allow asynchronous access for the dual ports, and a predetermined number of sense amplifier (defined "amp" hereinafter) circuits each connected to one of the complementary bit line pairs.

In operation, it is assumed that each of the complementary bit line pairs is under "high" at first in accordance with the initialization of the memory apparatus. When a word selection signal becomes "high" on a word line for a first selected port, a signal level difference begins to be produced between bit lines of a complementary bit line pair for the first selected port dependent on a content of a memory cell. Subsequently, when a word signal becomes "high" on a word line for a second selected port, a signal level difference begins to be produced between bit lines of a complementary bit line pair for the second selected port dependent on the content of the memory cell in the same manner as in the first selected port. At this moment, a sense amp circuit connected to the bit lines for the first selected port is enabled to amplify and stabilize the signal level difference. Thus, information is read from a port corresponding to a selected memory cell. The structure and operation of the conventional semiconductor memory apparatus of the complementary bit line type will be explained in more detail later.

According to the conventional semiconductor memory apparatus, however, there are disadvantages that an erasure or a destruction of information occurs in a memory cell, and that erroneous information is read from a memory cell, because a signal level is pulled, for instance, from "high" to "low" on a bit line of the second selected port under the influence of a signal level on a bit line of the first selected port, where the bit lines of the first and second selected ports are heavily coupled by a line-to-line capacitance produced therebetween. This results in an inversion of a readout information at the second selected port.

These disadvantages will be overcome, if the line-to-line capacitance is lowered to a predetermined level between adjacent bit lines of the dual ports, or if accesses are synchronized between the dual ports. For this purpose, the length of bit lines must be shortened to reduce the line-to-line capacitance, making it difficult to increase the memory capacity. Further, access control of the dual ports will be complicated.

SUMMARY OF THE INVENTION

Accordingly, it is an object of the invention to provide a semiconductor memory apparatus in which a memory capacity can be increased without the influence of a line-to-line capacitance.

It is a further object of the invention to provide a semiconductor memory apparatus in which there is no limitation in an access to dual ports.

According to the invention, a semiconductor memory apparatus comprises, a predetermined number of memory cells, each storing a binary information;

a plurality of complementary bit line pairs, to which corresponding memory cells are connected, each complementary bit line pair being accessible to the corresponding memory cells;

a plurality of sense amplifier circuits, each connected to a complementary bit line pair and amplifying a signal level difference between bit lines of the complementary bit line pair; and a plurality of grounded lines each provided between adjacent complementary bit line pairs and avoiding the formation of a line-to-line capacitance between adjacent bit lines of the adjacent complementary bit line pairs.

BRIEF DESCRIPTION OF DRAWINGS

The invention will be explained in more detail in conjunction with appended drawings wherein, FIG. 5 is a timing chart showing operation in the embodiment at the present invention shown in FIG. 3.

DESCRIPTION OF PREFERRED EMBODIMENTS

Before explaining an embodiment according to the invention, the aforementioned conventional semiconductor memory apparatus of a complementary bit line type will be explained with reference to FIG. 1. The semiconductor memory apparatus comprises complementary bit line pairs $D_1$ and $\overline{D}_1$, $D_2$ and $\overline{D}_2$, - - - for ports $1_1$, $1_2$, - - - , word lines $11_1$ and $12_1$, - - - crossing the bit line pairs, memory cells 3, - - - to be addressed by the bit line pairs and the word lines, and sense amp circuits $4_1$, $4_2$, - - - each connected to a corresponding bit line pair among the bit line pairs. One of the memory cells 3 includes transfer gate MOS transistors 3A, 3B, 3C and 3D, and driver MOS transistors 3E and 3F. As clearly shown in FIG. 1, the transfer gate transistors 3A and 3B are connected to the bit line pair $D_1$ and $\overline{D}_1$ and the word line $11_1$, and the transfer gate transistors 3C and 3D are connected to the bit line pair $D_2$ and $\overline{D}_2$ and the word line $12_1$. On the other hand, the driver transistors 3E and 3F are connected by drain electrodes thereof through the transfer gate transistors 3A, 3B, 3C and 3D to the bit line pairs and the word lines, and by source electrodes to the ground. If it is assumed that a content of the memory cell 3 is "1", the drain electrode of the driver transistor 3E is "high", so that the driver transistor 3F is connected to ground rendered conductive. Therefore, (coupled to ground) the drain electrode of the driver transistor 3F is "low", so that the driver transistor 3E is not connected to ground rendered conductive.

The sense amp circuits $4_1$ and $4_2$ include MOS transistors $4A_1$, $4B_1$ and $4C_1$, and $4A_2$, $4B_2$, and $4C_2$, and allow a sense amp enabling signal to be applied to each of the gate electrodes of the MOS transistors $4C_1$ and $4C_2$. In this semiconductor memory apparatus, parasitic capacitances $C_1$, $C_3$, $C_4$, $C_5$, $C_6$ and $C_7$ are produced as shown in FIG. 1, and a line-to-line capacitance $C_2$ is produced between the bit lines $\overline{D}_1$ and $D_2$.

Figure 2:
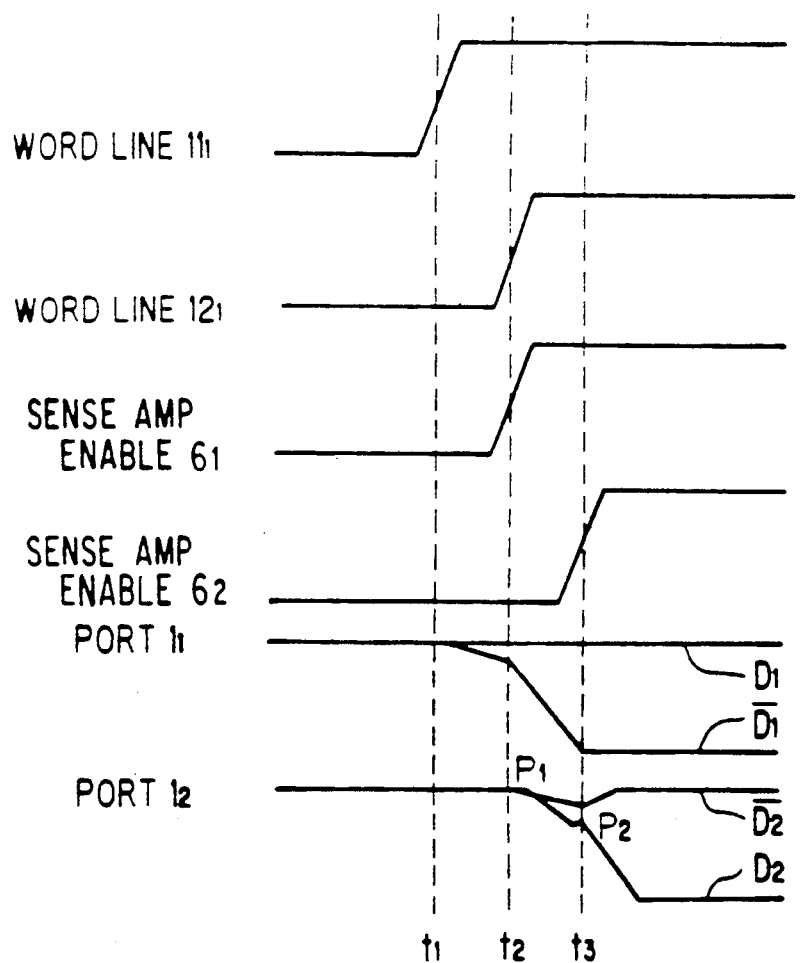
FIG. 2 is a timing chart showing operation in the conventional semiconductor memory apparatus.

In operation, the bit lines $D_1$, and $\overline{D}_1$, and $D_2$ and $\overline{D}_2$ for the ports $1_1$ and $1_2$ are initialized to be "high" at first as shown in FIG. 2. At time $t_1$, when a word selection signal for the port $1_1$ is enabled on the word line $11_1$, a signal level difference begins to be produced between the bit lines $D_1$ and $\overline{D}_1$ for the port $1_1$ in accordance with a content "1" of the memory cell 3 as described before. Subsequently, when a word selection signal for the port $1_2$ is enabled on the word line $12_1$ at time $t_2$, a signal level difference begins to be produced in the same manner as in the port $1_1$. At this moment, an enabling signal is applied to an enabling signal line $6_1$ of the MOS transistor $4C_1$ in the sense amp circuit $4_1$, so that the signal level difference between the bit lines $D_1$ and $\overline{D}_1$ for the port $1_1$ is amplified in the sense amp circuit $4_1$ to stabilize a state of the signal level difference. In this situation, a signal level of the bit line $D_2$ for the port $1_2$ is pulled from "high" to "low" in accordance with the influence of the line-to-line capacitance $C_2$ as indicated by a point $P_1$, although the signal level is inherently "high" dependent on the content of the memory cell 3. On the contrary, a signal level of the bit line $\overline{D}_2$ becomes "high" invertedly. At time $t_3$, a sense amp enabling signal is applied to an enabling signal line $6_2$ of the MOS transistor $4C_2$ in the sense amp circuit $4_2$ to read information from the memory cell 3 at the port $1_2$. Although the signal level of the bit line $D_2$ exhibits a tendency to restore the inherent state as indicated by a point $P_2$, it can not get back to a state correctly based on the content of the memory cell 3. As a result, an inverted signal is read at the port $1_2$ from the memory cells. Therefore, the aforementioned disadvantages are produced by the conventional semiconductor memory apparatus of the complementary bit line type.

Next, a semiconductor memory apparatus of a complementary bit line type while referring to an embodiment according to the invention will be explained in FIG. 3. The semiconductor memory apparatus comprises memory cell arrays $2_1$, $2_2$, $2_3$, - - -, each of which includes memory cells $3_1$, $3_2$, $3_3$, - - - each connected to bit line pairs $D_1$ and $\overline{D}_1$ for a port $1_1$, $D_2$ and $\overline{D}_2$ for a port $1_2$, - - - and to corresponding word lines $11_1$ and $12_1$, $11_2$ and $12_2$, $11_3$ and $12_3$, - - -, sense amp circuits $4_1$, $4_2$, $4_3$, $4_4$, $4_5$, $4_6$ - - - each connected to a corresponding bit line pair among the bit line pairs $D_1$ and $\overline{D}_1$ for the port $1_1$, and $D_2$ and $\overline{D}_2$ for the port $1_2$, and other bit line pairs for ports $1_3$, $1_4$, $1_5$, $1_6$ - - -, and to sense amp enabling line $6_1$ or $6_2$, and sealed lines $5_1$, $5_2$, $5_3$, $5_4$, $5_5$, - - - each connected to ground and provided between bit lines for each two adjacent ports.

Figure 1:
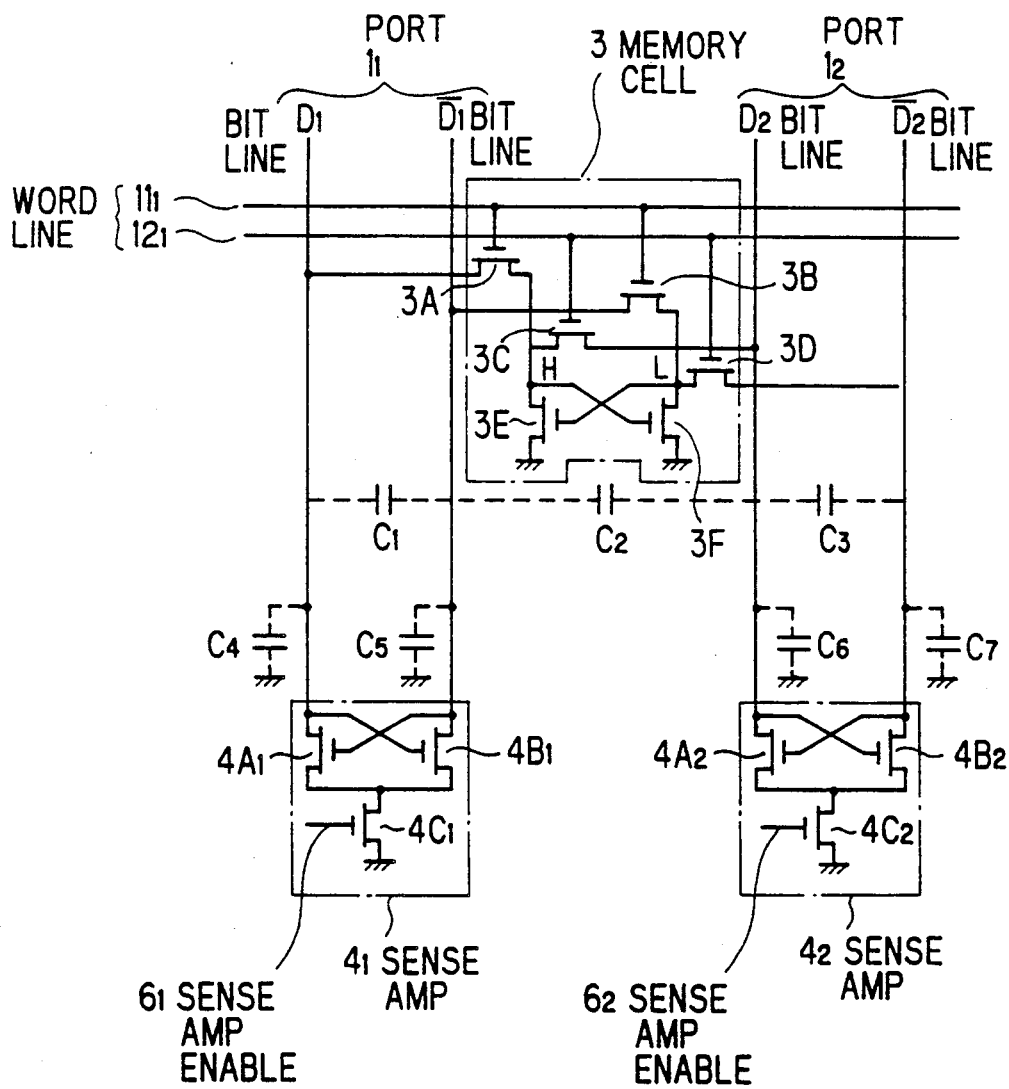
FIG. 1 is a circuit diagram showing a conventional semiconductor memory apparatus.
Figure 3:
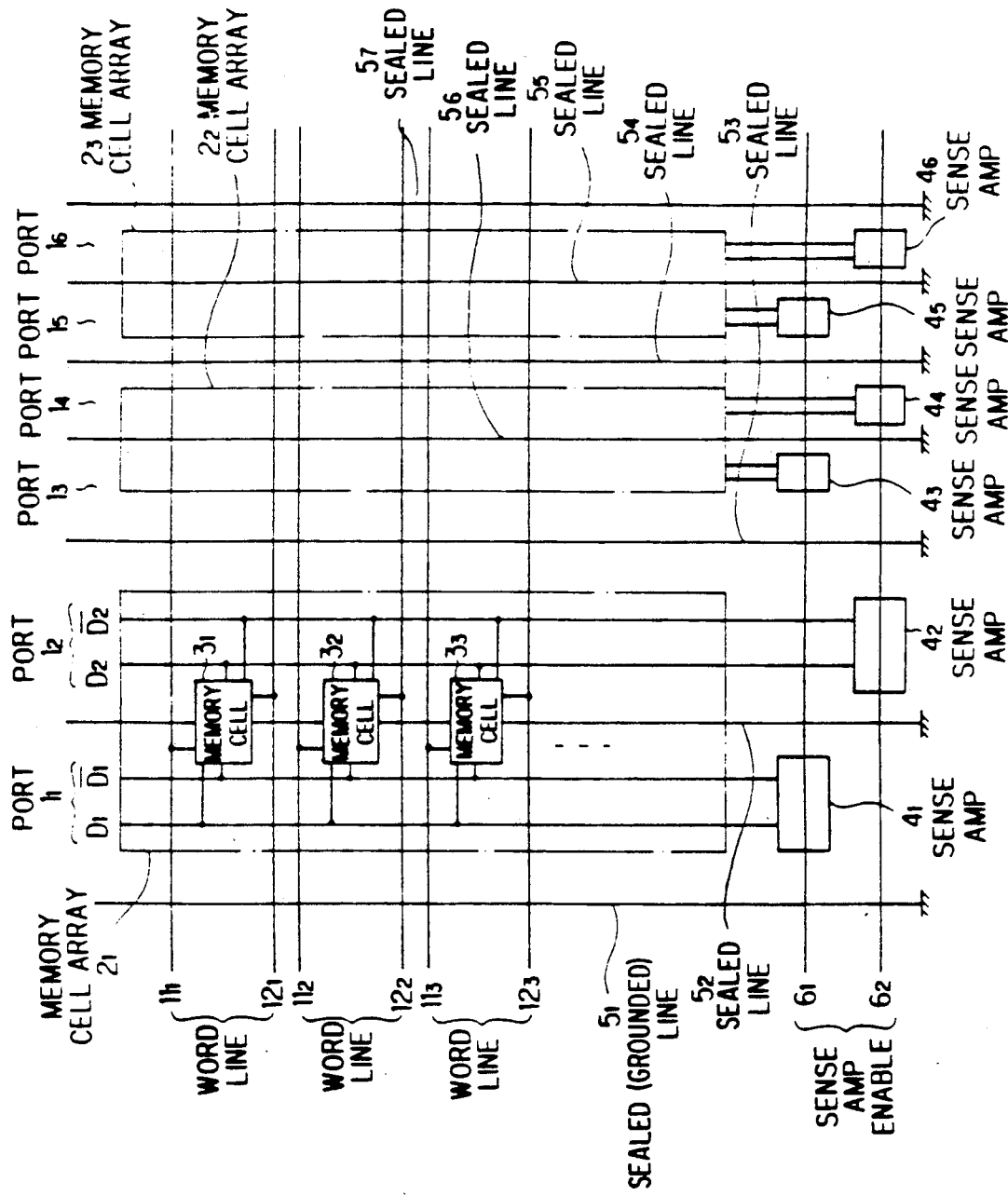
FIG. 3 is a matrix diagram showing an embodiment according to the invention.
Figure 4:
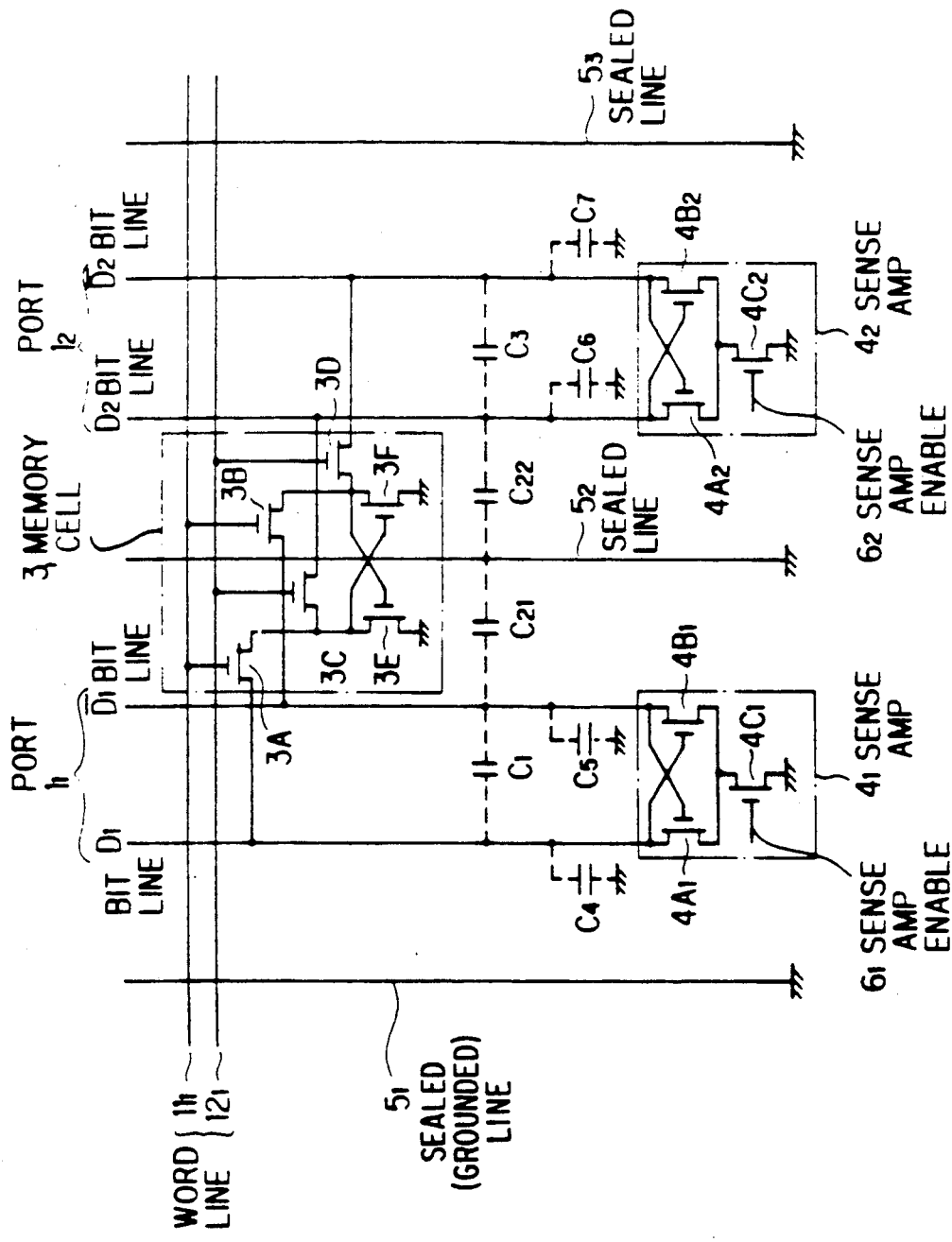
FIG. 4 is a circuit diagram showing a pertinent portion in the embodiment of the present invention shown in FIG. 3.

FIG. 4 shows a pertinent portion of the semiconductor memory apparatus in the embodiment of FIG. 3, wherein like parts are indicated by like reference numerals in FIGS. 1 and 3. The difference between the semiconductor memory apparatus in the embodiment and the conventional one is that the former further comprises the sealed (grounded) lines $5_1$, $5_2$, $5_3$, $5_4$, $5_5$, - - - to avoid the aforementioned influence of the line-to-line capacitance. As shown in FIG. 4, the line-to-line capacitance $C_2$ is no longer produced when the grounded line $5_2$ is provided between the bit lines $\overline{D}_1$ and $D_2$. Instead, capacitances $C_{21}$ and $C_{22}$ are produced between the bit line $\overline{D}_1$ and the grounded line $5_2$, and the grounded line $5_2$ and the bit line $D_2$. The grounded line $5_2$ is preferably provided, such that the capacitances $C_{21}$ and $C_{22}$ are equal in value.

In operation, the bit lines $D_1$ and $\overline{D}_1$, and $D_2$ and $\overline{D}_2$ for the ports $1_1$ and $1_2$ are initialized to be "high" at first as shown in FIG. 5. At time $t_1$, when a word selection signal for the port $1_1$ is enabled on the word line $11_1$, a signal level difference begins to be produced between the bit lines $D_1$ and $\overline{D}_1$ for the port $1_1$ in accordance with a content "1" of the memory cell 3 in the same manner as in the conventional memory apparatus. Subsequently, when a word selection signal for the port $1_2$ is enabled on the word line $12_1$ at time $t_2$, a signal level difference begins to be produced in the same manner as in the port $1_1$. At this moment, an enabling signal is applied to an enabling signal line $6_1$ of the MOS transistor $4C_1$ in the sense amp circuit $4_1$, so that the signal level difference between the bit lines $D_1$ and $\overline{D}_1$ for the port $1_1$ is amplified in the sense amp circuit $4_1$ to stabilize a state of the signal level difference. At the same time, a signal level difference begins to be produced between the bit lines $D_2$ and $\overline{D}_2$ for the port $1_2$ in accordance with the content of the memory cell 3. In this situation, a signal level of the bit line $D_2$ continues to be "high", because there is no line-to-line capacitance between the bit lines $\overline{D}_1$ and $D_2$. At time $t_3$, an enabling signal is applied to an enabling signal line $6_2$ of the MOS transistor $4C_2$ in the sense amp circuit $4_2$, so that the signal level difference between the bit lines $D_2$ and $\overline{D}_2$ for the port $1_2$ is amplified in the sense amp circuit $4_2$ to stabilize a state of the signal level difference. Thus, information of the memory cell 3 can be read at the dual ports $1_1$ and $1_2$ without any complicated control in regard to a readout timing and so on.

Although the invention has been described with respect to specific embodiment for complete and clear disclosure, the appended claims are not to thus limited but are to be construed as embodying all modifications and alternative constructions that may occur to one skilled in the art which fairly fall within the basic teaching herein set forth.

What is claimed is:

1. A semiconductor apparatus, comprising:
   a predetermined number of memory cells, each storing a binary information;
   a plurality of complementary bit line paris, wherein two of said complementary bit line pairs are coupled to a corresponding memory cell of said memory cells, and wherein two of said complementary bit line pairs are accessible to each of said corresponding memory cell;
   a plurality of sense amplifier circuits, each of said sense amplifier circuits being connected to a corresponding one of said complementary bit line pairs for amplifying a signal level difference between bit lines of said corresponding complementary bit line pair; and
   a plurality of grounded lines, each of said grounded lines having a fixed potential and being provided between adjacent ones of said complementary bit line pairs so as to avoid the formation of a line-toline capacitance which is normally produced between two adjacent bit lines of different adjacent complementary bit line pairs.

2. A semiconductor memory apparatus according to claim 1, wherein at least one of said grounded lines is disposed so as to respectively provide an equal capacitance value between two adjacent bit lines of different complementary bit line pairs and said at least one of said grounded lines.

* * * * *